(12) United States Patent
Kato et al.

(10) Patent No.: US 9,236,230 B2
(45) Date of Patent: Jan. 12, 2016

(54) PLASMA PROCESSING APPARATUS AND GAS SUPPLY METHOD THEREFOR

(75) Inventors: Yoshiyuki Kato, Miyagi (JP); Norihiko Amikura, Miyagi (JP); Risako Miyoshi, Miyagi (JP); Kimihiro Fukasawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 815 days.

(21) Appl. No.: 13/483,843

(22) Filed: May 30, 2012

(65) Prior Publication Data
US 2012/0305188 A1    Dec. 6, 2012

Related U.S. Application Data

(60) Provisional application No. 61/497,122, filed on Jun. 15, 2011.

(30) Foreign Application Priority Data

May 31, 2011  (JP) ................................. 2011-121475

(51) Int. Cl.
H01J 37/32    (2006.01)
C23C 16/455    (2006.01)
C23C 16/52    (2006.01)

(52) U.S. Cl.
CPC ..... *H01J 37/32449* (2013.01); *C23C 16/45523* (2013.01); *C23C 16/45525* (2013.01); *C23C 16/52* (2013.01); *H01J 37/3244* (2013.01); *Y10T 137/0368* (2015.04)

(58) Field of Classification Search
CPC ............ H01J 37/32449; H01J 37/3244; C23C 16/45525; C23C 16/45538; C23C 16/45561; C23C 16/52; C23C 16/45523; Y10T 137/0368
USPC ............ 118/715; 156/345.26, 345.29; 137/10
See application file for complete search history.

(56) References Cited

U.S. PATENT DOCUMENTS

| 2002/0148561 | A1 | 10/2002 | Tetsuhiro et al. |
| 2007/0023394 | A1* | 2/2007 | Murakami et al. ............... 216/67 |
| 2008/0102202 | A1* | 5/2008 | Chandrachood et al. ... 427/248.1 |
| 2009/0053900 | A1 | 2/2009 | Nozawa et al. |
| 2009/0061541 | A1* | 3/2009 | Moriya et al. ................... 438/10 |

(Continued)

FOREIGN PATENT DOCUMENTS

| CN | 1380685 A | 11/2002 |
| CN | 101416284 A | 4/2009 |
| JP | 11-195641 | 7/1999 |
| JP | 2000-306887 | 11/2000 |

(Continued)

*Primary Examiner* — Jeffrie R Lund
(74) *Attorney, Agent, or Firm* — Brundidge & Stanger, P.C.

(57) ABSTRACT

It is possible to prevent processing gases from being mixed when alternately supplying the processing gases while alternately switching the processing gases and to suppressed a transient phenomenon more efficiently as compared to conventional cases. When supplying at least two kinds of processing gases (e.g., a $C_4F_6$ gas and a $C_4F_8$ gas) into a processing chamber while alternately switching the at least two kinds of processing gases during a plasma process on a wafer, the supply of each processing gas can be alternately turned on and off by alternately setting an instruction flow rate of a mass flow controller to be a predetermined flow rate and a zero flow rate while a downstream opening/closing valve provided at a downstream side of the mass flow controller is open.

6 Claims, 12 Drawing Sheets

(56) References Cited

U.S. PATENT DOCUMENTS

2009/0130859 A1* 5/2009 Itatani et al. .................. 438/778
2012/0305188 A1* 12/2012 Kato et al. ............... 156/345.26

FOREIGN PATENT DOCUMENTS

| JP | 2002-85962 | 3/2002 |
| JP | 2005515631 A | 5/2005 |

* cited by examiner

PLASMA PROCESSING APPARATUS AND GAS SUPPLY METHOD THEREFOR

CROSS-REFERENCE TO RELATED APPLICATION

This application claims the benefit of Japanese Patent Application No. 2011-121475 filed on May 31, 2011, and U.S. Provisional Application Ser. No. 61/497,122 filed on Jun. 15, 2011, the entire disclosures of which are incorporated herein by reference.

FIELD OF THE INVENTION

The present disclosure relates to a plasma processing apparatus capable of supplying a multiple number of gases into a processing chamber and also relates to a gas supply method therefor.

BACKGROUND OF THE INVENTION

In a semiconductor manufacturing process, there is used a plasma processing apparatus configured to supply a gas into a processing chamber and perform a certain process such as a film forming process or an etching process on a processing target substrate (hereinafter, simply referred to as a "substrate") such as a semiconductor wafer, a liquid crystal substrate, or a substrate for a solar cell.

In a gas supply system of such a plasma processing apparatus, when supplying a mixture of multiple kinds of gases, multiple gas supply paths for supplying the multiple kinds of gases respectively are provided. Further, the multiple gas supply paths are joined to a single common gas supply path through which the processing gases are introduced into the processing chamber of the plasma processing apparatus.

A flow rate controller such as a mass flow controller (MFC) is provided on each of the gas supply paths, and opening/closing valves are provided at an upstream side and a downstream side of the flow rate controller, respectively. Further, the opening/closing valve may be provided only at the downstream side of the flow rate controller.

Conventionally, the supply of each processing gas is turned on and off by opening and closing each of the opening/closing valves, and a flow rate of the processing gas flowing in each of the gas supply paths is controlled by setting a certain flow rate of the flow rate controller (see, for example, Patent Document 1).

Patent Document 1: Japanese Patent Laid-open Publication No. 2002-85962
Patent Document 2: Japanese Patent Laid-open Publication No. H11-195641
Patent Document 3: Japanese Patent Laid-open Publication No. 2000-306887

Recently, as processes are diversified and there is an increasing demand for the miniaturization of semiconductor devices, various processes may be consecutively performed in a single apparatus while switching different kinds of processing gases. In such a case, if the supply of each processing gas is turned on and off by opening and closing the opening/closing valve of the mass flow controller, a flow rate control by the mass flow controller is started after a residual gas in the mass flow controller is once introduced into the processing chamber.

Accordingly, when switching the processing gases, a transient phenomenon may occur, causing a problem that a flow rate of the gas supplied into the processing chamber is not stabilized. The transient phenomenon of the gas flow rate tends to occur more readily as a time interval for switching the gases is shorter.

To solve the problem, by performing a process for stabilizing the gas flow rate each time the gases are switched, the transient phenomenon of the gas flow rate may be suppressed. However, in such a case, a throughput may be deteriorated.

Further, it is disclosed in Patent Documents 2 and 3 that a transition process is provided when switching an etching gas and a deposition gas alternatively. In this transition process, before stopping the supply of one gas, the supply of the other gas is started, and a flow rate of the one gas is gradually decreased while a flow rate of the other gas is gradually increased. According to the flow rate control of Patent Documents 2 and 3, however, the alternately supplied gases are mixed when the gases are switched. In such a case, depending on the kind of the switched gases, an adverse effect on the substrate process may not be negligible.

BRIEF SUMMARY OF THE INVENTION

In view of the foregoing problem, illustrative embodiments provide a plasma processing apparatus capable of preventing processing gases from being mixed when supplying the processing gases while alternately switching the processing gases, and capable of suppressing a transient phenomenon of a gas flow rate more efficiently as compared to conventional cases. Illustrative embodiments also provide a gas supply method used in the plasma processing apparatus.

In accordance with one aspect of an illustrative embodiment, there is provided a gas supply method used in a plasma processing apparatus that supplies a gas into an evacuable processing chamber to generate plasma and that performs a plasma process on a substrate within the processing chamber by the plasma. Here, the plasma processing apparatus may include a gas supply system, having multiple processing gas supply sources and multiple gas supply paths respectively connected to the processing gas supply sources, for supplying a multiple number of processing gases into the processing chamber via the gas supply paths; a flow rate controller provided at each of the gas supply paths and configured to control a flow rate of a processing gas flowing in the gas supply path by adjusting an opening degree of a flow rate control valve according to an instruction flow rate; and a downstream opening/closing valve provided at a downstream side of each flow rate controller. Furthermore, the gas supply method may include when supplying at least two kinds of processing gases into the processing chamber while alternately switching the at least two kinds of processing gases during the plasma process on the substrate, alternately turning on and off the supply of each processing gas by alternately setting the instruction flow rate of the flow rate controller to be a predetermined flow rate and a zero flow rate while the downstream opening/closing valve provided at the downstream side of the flow rate controller is open.

In accordance with another aspect of an illustrative embodiment, there is provided a plasma processing apparatus that supplies a gas into an evacuable processing chamber to generate plasma and performs a plasma process on a substrate by the plasma. The plasma processing apparatus includes a gas supply system, having multiple processing gas supply sources and multiple gas supply paths respectively connected to the processing gas supply sources, for supplying a multiple number of processing gases into the processing chamber via the gas supply paths; a flow rate controller provided at each of the gas supply paths and configured to control a flow rate of a processing gas flowing in the gas supply path by adjusting an opening degree of a flow rate control valve according to an instruction flow rate; an opening/closing valve provided at a downstream side of each flow rate controller; and a controller configured to set a flow rate of the flow rate controller. Further, when supplying at least two kinds of processing gases into the processing chamber while alternately switching the at least two kinds of processing gases during the plasma process on the substrate, the controller may alternately turn on and off the supply of each processing gas by alternately setting the instruction flow rate of the flow rate controller to be a predetermined flow rate and a zero flow rate while the opening/closing valve provided at the downstream side of the flow rate controller is open.

In accordance with the illustrative embodiment, it is possible to turn on and off the processing gases to be alternately supplied into the processing chamber by alternately setting the instruction flow rate of the flow rate controller to be the predetermined flow rate and the zero flow rate while the downstream opening/closing valve provided at the downstream side of the flow rate controller is open. Accordingly, it is possible to prevent the processing gases from being mixed when alternately switching the processing gases and to suppress a transient phenomenon of the gas flow rate, generated in the processing chamber, more efficiently as compared to conventional cases.

The plasma processing apparatus may further include an upstream opening/closing valve provided at an upstream side of each flow rate controller. Furthermore, the supply of each processing gas may be alternately turned on and off by alternately setting the instruction flow rate of the flow rate controller to be a predetermined flow rate and a zero flow rate while the upstream opening/closing valve provided at the upstream side of the flow rate controller as well as the downstream opening/closing valve provided at the downstream side of the flow rate controller is open.

Therefore, it is possible to alternately turn on and off the supply of the processing gas by alternately setting the instruction flow rate of the flow rate controller to be the predetermined flow rate and the zero flow rate while the upstream opening/closing valve of the flow rate controller as well as the downstream opening/closing valve of the flow rate controller is open. Accordingly, it is possible to prevent the processing gases from being mixed when alternately switching the processing gases. Further, it is also possible to suppress a transient phenomenon of the gas flow rate in the flow rate controller as well as a transient phenomenon of the gas flow rate in the processing chamber, more efficiently as compared to conventional cases.

Furthermore, when supplying the processing gases into the processing chamber while alternately switching the processing gases, it may be determined whether a supply duration time before switching each processing gas is equal to or smaller than a threshold value. If it is determined that the supply duration time is equal to or smaller than the threshold value, the supply of the processing gas may be turned on and off by alternately setting the instruction flow rate of the flow rate controller to be the predetermined flow rate and the zero flow rate while the downstream opening/closing valve is open. If it is determined that the supply duration time is larger than the threshold value, the supply of the processing gas may be turned on and off by opening and closing the downstream opening/closing valve. In this case, the threshold value may be set to be in a range of about 1 second to about 15 seconds.

Moreover, the switched processing gases may be, e.g., at least two kinds of etching gases. Further, the switched processing gases may include at least an etching gas and a cleaning gas.

In accordance with the illustrative embodiment, when alternately switching the processing gases, the processing gases can be prevented from being mixed, and a transient phenomenon of a gas flow rate can be suppressed more efficiently as compared to conventional cases. Thus, the switchover of the processing gases can be performed more stably and more easily.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
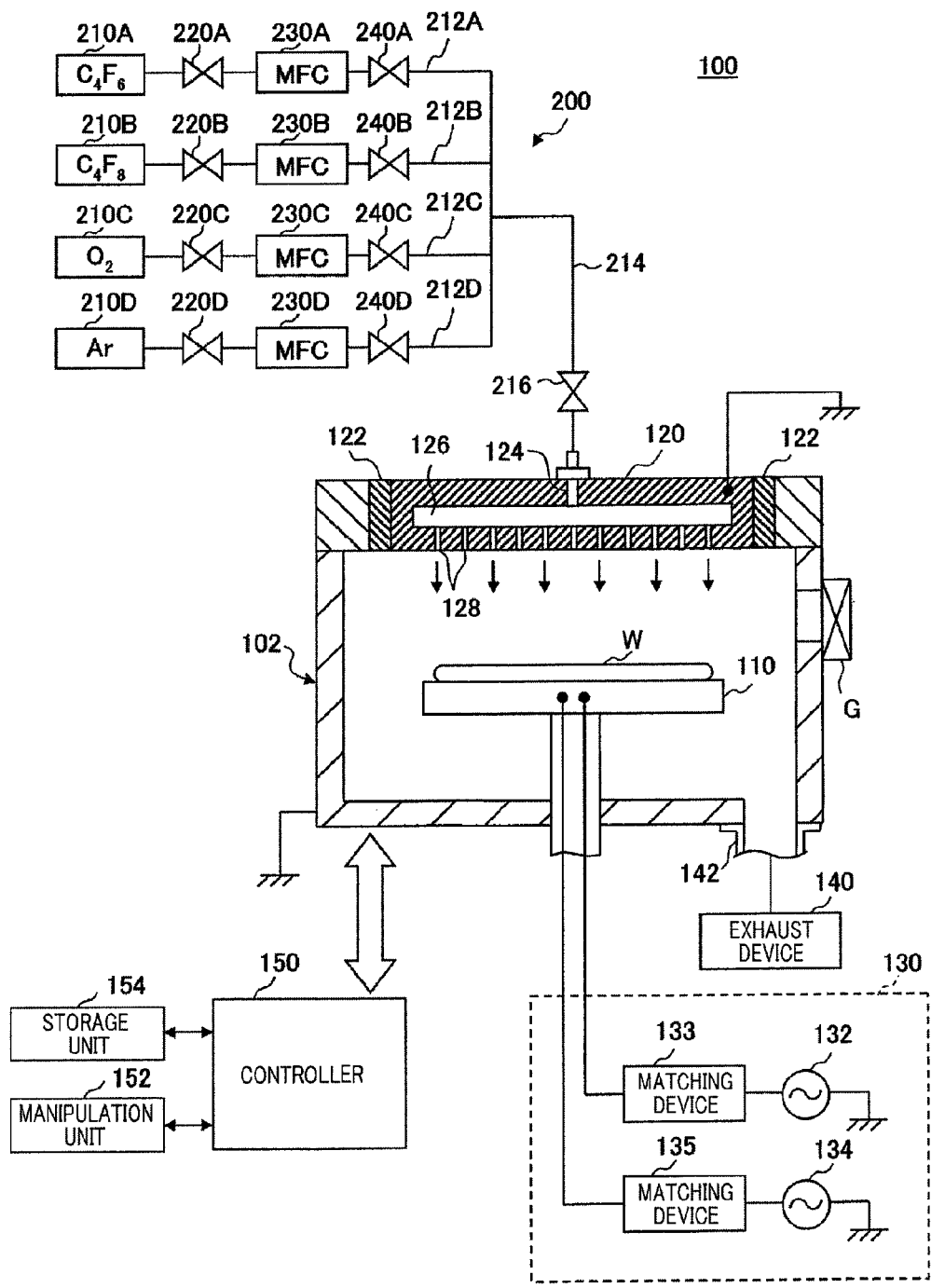
FIG. 1 is a cross sectional view schematically illustrating a configuration of a plasma processing apparatus in accordance with an illustrative embodiment.

Hereinafter, illustrative embodiments will be described in detail with reference to the accompanying drawings. Through the specification and the drawings, parts having substantially the same functions and configurations will be assigned same reference numerals, and redundant description will be omitted. In the specification, 1 mTorr indicates $(10^{-3} \times 101325/760)$ Pa, and 1 sccm indicates $(10^{-6}/60)$ m$^3$/sec.

(Configuration Example of Plasma Processing Apparatus)

First, a configuration example of a plasma processing apparatus in accordance with an illustrative embodiment will be described. Here, for example, the plasma processing apparatus is configured as a parallel plate type plasma processing apparatus that includes an upper electrode and a lower electrode provided in a processing chamber so as to face each other and supplies a processing gas into the processing chamber through the upper electrode. FIG. 1 is a cross sectional view schematically illustrating a configuration of a plasma processing apparatus 100 in accordance with the illustrative embodiment.

The plasma processing apparatus 100 includes a processing chamber 102 made of a conductive material such as aluminum; and a gas supply system 200 configured to supply multiple kinds of gases into the processing chamber 102. The processing chamber 102 is electrically grounded. A lower electrode (susceptor) 110 and an upper electrode 120 are provided within the processing chamber 102 to face each other. The lower electrode 110 also serves as a mounting table for mounting thereon a processing target substrate such as a semiconductor wafer W (hereinafter, simply referred to as a "wafer").

The lower electrode 110 is connected with a power supply device 130 that supplies dual frequency powers thereto. The power supply device 130 includes a first high frequency power supply 132 configured to supply a first high frequency power of a first frequency (a high frequency power for plasma generation); and a second high frequency power supply 134 configured to supply a second high frequency power of a second frequency lower than the first frequency (a high frequency power for bias voltage generation). The first and second high frequency power supplies 132 and 134 are electrically connected with the lower electrode 110 via first and second matching devices 133 and 135, respectively.

The first and second matching devices 133 and 135 are configured to match load impedance with internal (or output) impedance of the first and second high frequency power supplies 132 and 134, respectively. When plasma is generated within the processing chamber 102, the first and second matching devices 133 and 135 serve to apparently match the internal impedance of the first and second high frequency power supplies 132 and 134 with the load impedance.

The first high frequency power supply 132 outputs a high frequency power of a frequency higher than or equal to, e.g., about 27 MHz (e.g., about 40 MHz). The second high frequency power supply 134 outputs a high frequency power of a frequency lower than or equal to, e.g., about 13.56 MHz (e.g., about 2 MHz).

The upper electrode 120 is provided at a ceiling portion of the processing chamber 102 via a shield ring 122. The shield ring 122 covers a peripheral portion of the upper electrode 120. The upper electrode 120 may be electrically grounded as illustrated in FIG. 1. Alternatively, a variable DC power supply (not shown) may be connected to the upper electrode 120 to apply a DC voltage to the upper electrode 120.

The upper electrode 120 has a gas inlet opening 124 for introducing a gas from the gas supply system 200. Further, the upper electrode 120 also has therein a diffusion space 126 in which the gas introduced through the gas inlet opening 124 is diffused.

The upper electrode 120 has a multiple number of gas supply holes 128 through which the gas diffused in the diffusion space 126 is supplied into the processing chamber 102. The gas supply holes 128 are arranged so as to supply the gas into a space between the wafer W mounted on the lower electrode 110 and the upper electrode 120.

With this upper electrode 120, the gas from the gas supply system 200 is supplied into the diffusion space 126 through the gas inlet opening 124, and after diffused in this space, the gas is distributed into the gas supply holes 128 and is discharged toward the lower electrode 110 through the gas supply holes 128. A detailed configuration example of the gas supply system 200 will be described later.

An exhaust port 142 is formed at a bottom of the processing chamber 102, and by evacuating the processing chamber 102 through an exhaust device 140 connected to the exhaust port 142, an inside of the processing chamber 102 can be maintained at a desired vacuum level. A gate valve G is provided at a sidewall of the processing chamber 102. By opening the gate valve G, the wafer W can be loaded into or unloaded from the processing chamber 102.

The plasma processing apparatus 100 includes a controller 150 that controls an overall operation of the apparatus. The controller 150 is connected with a manipulation unit 152 that includes a keyboard through which an operator inputs commands to manage the plasma processing apparatus 100, a display that visually displays an operational status of the plasma processing apparatus 100, and so forth.

The controller 150 is also connected with a storage unit 154 that stores therein programs for implementing various processes performed in the plasma processing apparatus 100 under the control of the controller 150; and processing conditions (recipes) required for executing the programs.

By way of example, the storage unit 154 stores therein first and second processing conditions (recipes) to be described later. The processing conditions include multiple parameter values such as control parameters for controlling each component of the plasma processing apparatus 100, setup parameters, and so forth. For example, each of the processing conditions may include parameter values such as a flow rate ratio of processing gases (an instruction flow rate of each mass flow controller 230 or the like), a pressure within the processing chamber, a high frequency power, and so forth.

Further, these programs and the processing conditions may be stored in a hard disk or a semiconductor memory, or may be set in a certain area of the storage unit 154 while stored in a computer-readable portable storage medium such as a CD-ROM or a DVD.

The controller 150 reads out necessary programs or processing conditions from the storage unit 154 in response to, e.g., an instruction from the manipulation unit 152, and controls each component of the plasma processing apparatus 100. Therefore, a required process in the plasma processing apparatus 100 can be implemented. Further, the processing conditions can be edited by the manipulation unit 152.

(Gas Supply System)

Here, the detailed configuration example of the gas supply system 200 will be explained. In this illustrative embodiment, the gas supply system 200 is configured to selectively supply four kinds of gases (a $C_4F_8$ gas, a $C_4F_6$ gas, an $O_2$ gas, and an Ar gas) into the processing chamber 102. Among these gases, the $C_4F_8$ gas and the $C_4F_6$ gas are etching gases, and are alternately supplied. The $O_2$ gas and the Ar gas are supplied together with these etching gases when necessary.

To elaborate, the gas supply system 200 includes gas supply sources 210A to 210D for the $C_4F_8$ gas, the $C_4F_6$ gas, the $O_2$ gas, and the Ar gas, respectively. These gas supply sources 210A to 210D are connected to a common gas supply path (pipeline) 214 via gas supply paths (pipelines) 212A to 212D, respectively. An opening/closing valve 216 is provided at the common gas supply path 214, and a downstream side of the opening/closing valve is connected to the upper electrode 120. In addition, a filter for removing particles from a gas flowing in the common gas supply path 214 may be further provided at the common gas supply path 214.

The gas supply paths 212A to 212D are provided with mass flow controllers (MFC) 230A to 230D, respectively, as example flow rate controllers for controlling flow rates of gases flowing in the respective gas supply paths. Upstream opening/closing valves (first opening/closing valves) 220A to 220D and downstream opening/closing valves (second opening/closing valves) 240A to 240D are provided at the upstream side and the downstream side of the mass flow controllers (MFC) 230A to 230D, respectively.

Figure 2:
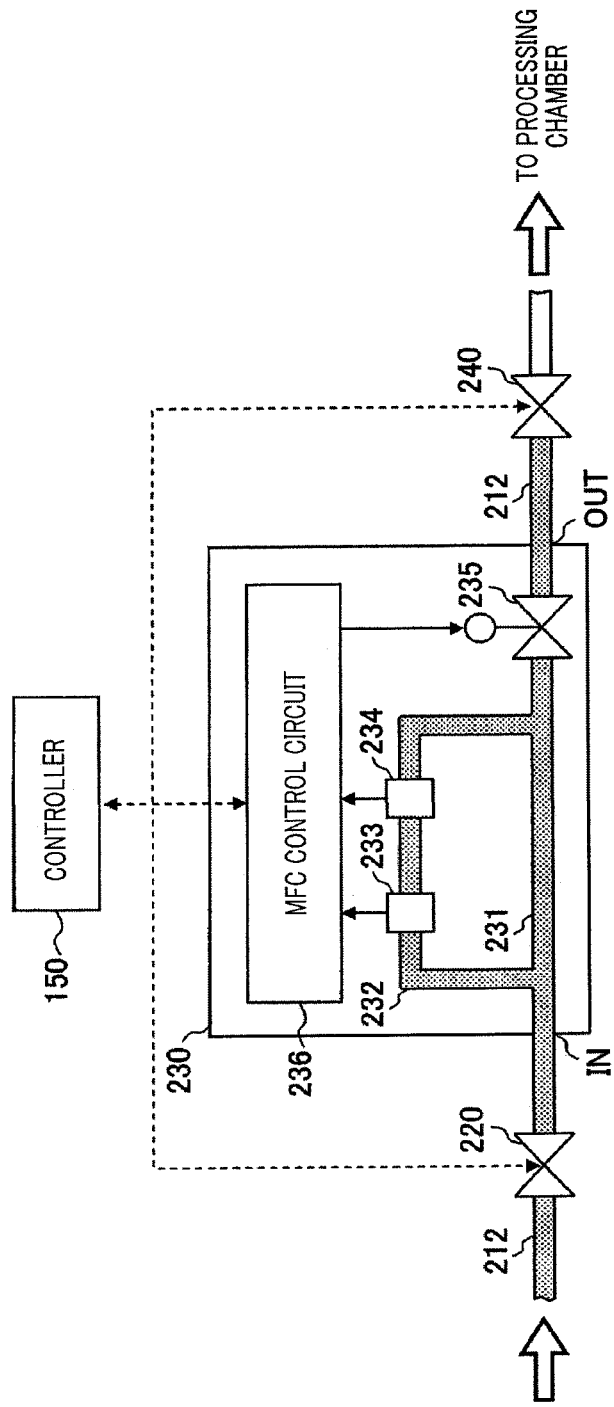
FIG. 2 is a diagram showing a configuration example of a mass flow controller in accordance with the illustrative embodiment.

Now, a detailed configuration example of the mass flow controllers (MFC) 230A to 230D will be described with reference to the accompanying drawings. FIG. 2 is a configuration view of a mass flow controller (MFC) in accordance with the present illustrative embodiment. Since the mass flow controllers (MFC) 230A to 230D have the same configuration, the notations A to D will be removed from the reference numerals, and a mass flow controller (MFC) 230 will be explained as a representative thereof.

As illustrated in FIG. 2, the mass flow controller (MFC) 230 includes a main flow path 231 and a side flow path 232 branched from the gas supply path 212. To elaborate, within the mass flow controller (MFC) 230, the gas introduced through a gas inlet IN from the gas supply path 212 are split into the main flow path 231 and the side flow path 232. Then, the split gases join again, and the gas is flown out into the gas supply path 212 through a gas outlet OUT via a flow rate control valve 235.

A flow rate sensor for measuring a flow rate of the gas within the gas supply path 212 is provided at the side flow path 232. The flow rate sensor includes an upstream sensor 233 provided at an upstream side of the side flow path 232 and a downstream sensor 234 provided at a downstream side of the side flow path 232.

Each of the upstream sensor 233 and the downstream sensor 234 may be formed of, but not limited to, a heating resistor wire. With this configuration, if a fluid flows in the upstream sensor 233, of the upstream sensor 233 losses its heat, and thus, the temperature of the upstream sensor 233 is decreased. In the downstream sensor 234, on the other hand, heat is added to the downstream sensor 234, and thus, the temperature of the downstream sensor 234 is increased. As a result, a temperature difference between the upstream sensor 233 and the downstream sensor 234 is generated. By detecting an output voltage (MFC output voltage) according to this temperature difference, the flow rate of the fluid can be detected.

The mass flow controller (MFC) 230 includes a MFC control circuit 236 configured to control the gas flow rate in the gas supply path 212 to be a set flow rate by adjusting an opening degree of the flow rate control valve 235 based on outputs of the flow rate sensors (upstream sensor 233 and downstream sensor 234).

When performing a supply control of the gas flowing in the gas supply path 212 by means of the mass flow controller (MFC) 230, a certain flow rate is set for the MFC control circuit 236 by the controller 150. The MFC control circuit 236 controls the opening degree of the flow rate control valve 235 so as to obtain the set flow rate. As a result, it is possible to control the flow rate of the gas flowing in the gas supply path 212.

By way of example, once a certain flow rate is set for the MFC control circuit 236, the flow rate control valve 235 becomes open and the opening degree thereof is adjusted. Therefore, the flow rate of the gas is controlled to the certain flow rate. If a zero flow rate is set, the flow rate control valve 235 becomes closed, and the supply of the gas is stopped (turned off). In accordance with the present illustrative embodiment, by using these operations, the flow rate control valve 235 within the mass flow controller 230 is used just like an opening/closing valve (on/off valve). Accordingly, a transient phenomenon of the gas flow rate can be suppressed when gases are switched. This gas supply control will be elaborated later.

Now, a specific example of a wafer process by the plasma processing apparatus 100 will be described. By way of example, in accordance with the present illustrative embodiment, a plasma etching is performed to form a hole or a trench having a certain aspect ratio on an oxide film (e.g., a silicon oxide film) formed on the wafer W by using a patterned film (e.g., a resist film or a polysilicon film) as a mask.

By way of example, in this plasma etching process, different kinds of processing gases are switched alternately in a short period of time while plasma is generated during the process. In this plasma etching process, for example, a first process using a processing gas (e.g., a $C_4F_6$ gas) having a strong deposition property and a second process using a processing gas (e.g., a $C_4F_8$ gas) having a weak deposition property may be alternately repeated while plasma is generated.

By this process, the etching can be performed while adjusting a hole diameter or a trench width not to be so large. Accordingly, it is possible to form a hole or a trench having a higher aspect ratio and a deeper depth on the surface of the wafer W. Further, since both of the switched gases such as the $C_4F_8$ gas and the $C_4F_8$ gas are plasma etching gases, plasma need not be turned on and off depending on the kind of the processing gases when the processing gases are switched. Thus, the plasma can be continuously generated by applying a high frequency power during the process. Accordingly, a throughput can be further improved.

Conventionally, the supply of the processing gas is turned on and off by opening and closing opening/closing valves 220 and 240 at the upstream and downstream sides of the mass flow controller 230, and the flow rate control valve 235 within the mass flow controller 230 is used only for controlling the flow rate of the processing gas, not for turning on and off the supply of the processing gas.

However, as in the plasma etching process in accordance with the present illustrative embodiment as described above, in the wafer process in which the multiple kinds of gases are supplied alternately, the processing gases need to be switched in a relatively short time period. Thus, if the supply of the processing gases are turned on and off by opening and closing the opening/closing valves 220 and 240 in this wafer process, the transient phenomenon (e.g., overshoot, fluctuation, or the like) of the gas flow rate may occur when the processing gases are switched. Further, the transient phenomenon of the gas flow rate tends to occur more readily as the time interval for switching the processing gases becomes shorter.

Figure 3:
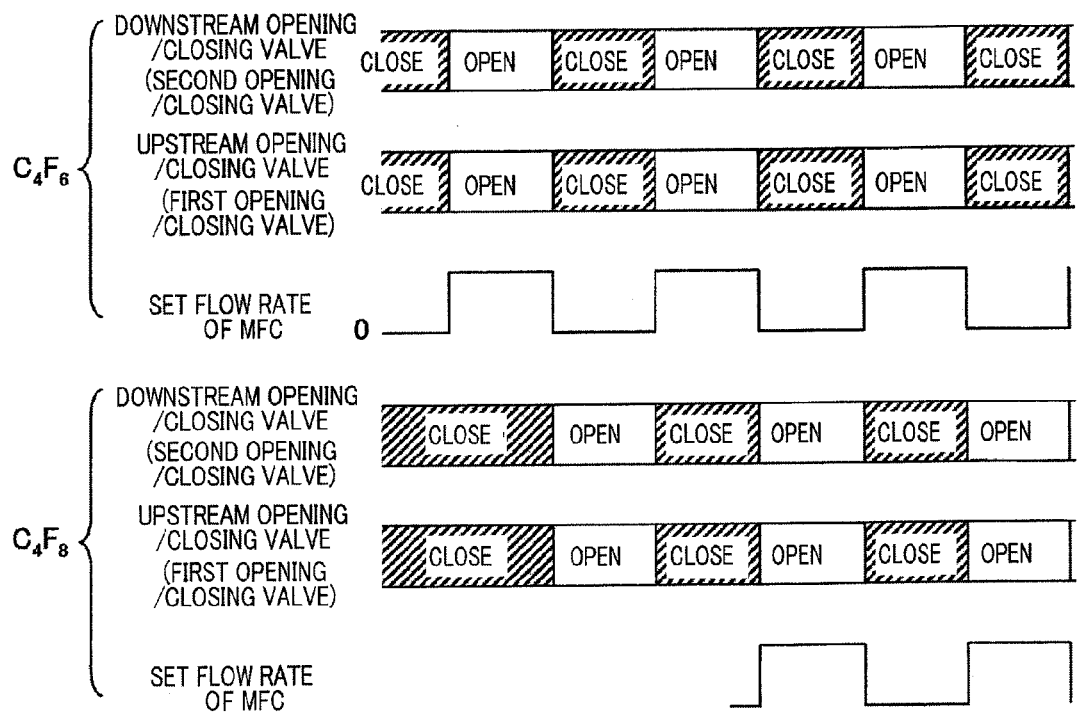
FIG. 3 is a timing chart showing a gas supply control in accordance with a comparative example.

Hereinafter, with reference to the accompanying drawings, the transient phenomenon of the gas flow rate will be described for a case of a gas supply control in accordance with a comparative example. FIG. 3 is a timing chart showing the gas supply control in accordance with the comparative example. In the gas supply control shown in FIG. 3, when the supply of the processing gases ($C_4F_6$ gas and $C_4F_8$ gas) are turned on and off by opening and closing the upstream opening/closing valve 220 and the downstream opening/closing valve 240, the transient phenomenon of the gas flow rate occurs in the processing chamber 102.

As shown in FIG. 3, in the gas supply control in accordance with the comparative example, when starting (turning on) the supply of the $C_4F_6$ gas, the downstream opening/closing valve 240A is first opened and then, the upstream opening/closing valve 220A is opened, for example. After a lapse of a certain delay time, the certain flow rate of the mass flow controller 230A is set. When stopping (turning off) the supply of the $C_4F_6$ gas, the upstream opening/closing valve 220A and the downstream opening/closing valve 240A are closed in a reverse order to that for starting (turning on) the supply of the gas. Then, after a certain delay time passes by, the zero flow rate of the mass flow controller 230A is set.

Likewise, when starting (turning on) the supply of the $C_4F_8$ gas, the downstream opening/closing valve 240B is first opened and then, the upstream opening/closing valve 220B is opened, for example. After a lapse of a certain delay time, the certain flow rate of the mass flow controller 230B is set. When stopping (turning off) the supply of the $C_4F_8$ gas, the upstream opening/closing valve 220B and the downstream opening/closing valve 240B are closed in the reverse order to that for starting (turning on) the supply of the gas. Then, after a certain delay time passes by, the zero flow rate of the mass flow controller 230B is set.

In this way, by turning on and off the supply of the $C_4F_6$ gas and the supply of the $C_4F_8$ gas alternately, the $C_4F_6$ gas and the $C_4F_8$ gas can be supplied alternately.

In the gas supply control in accordance with this comparative example, when stopping (turning off) the supply of each processing gas, both of the upstream opening/closing valve 220 and the downstream opening/closing valve 240 are closed. Accordingly, as shown in FIG. 2, a gas may remain between the upstream opening/closing valve 220 and the downstream opening/closing valve 240 including the inside of the mass flow controller 230.

Accordingly, when opening the downstream opening/closing valve 240 to start (turn on) the supply of each processing gas, the gas remaining at the downstream side of the flow rate control valve 235 is introduced into the processing chamber 102 at one time. Then, after the flow rate control valve 235 is opened and the opening degree thereof is adjusted, the flow rate control is started. Accordingly, the transient phenomenon may easily occur immediately after the supply of the processing gas is started. As a result, there is a problem that the flow rate of the processing gas supplied into the processing chamber 102 may not be stable in an initial stage of the supply of the processing gas.

To solve this problem, in accordance with the present illustrative embodiment, as for the gas supply path 212 for alternately supplying the multiple processing gases, the supply of the processing gas is turned on and off by alternately setting a certain flow rate and a zero flow rate of the mass flow controller 230 while at least the downstream opening/closing valve 240 is open.

In accordance with this method, the supply of the processing gas can be turned on and off by opening and closing the flow rate control valve 235 of the mass flow controller 230. Accordingly, even if the supply of the processing gas is turned on and off repeatedly, a residual gas does not stay at the downstream side of the flow rate control valve 235. Thus, the transient phenomenon of the flow rate of the gas supplied into the processing chamber 102 can be suppressed more efficiently as compared to the conventional cases. Accordingly, the processing gases can be switched more stably and successfully.

Further, since turning on and off each of the processing gases are repeated alternately, the switched processing gases can be prevented from being mixed. Accordingly, an adverse influence on the wafer process, which might be caused by the mixture of the switched processing gases, can be avoided.

Figure 4:
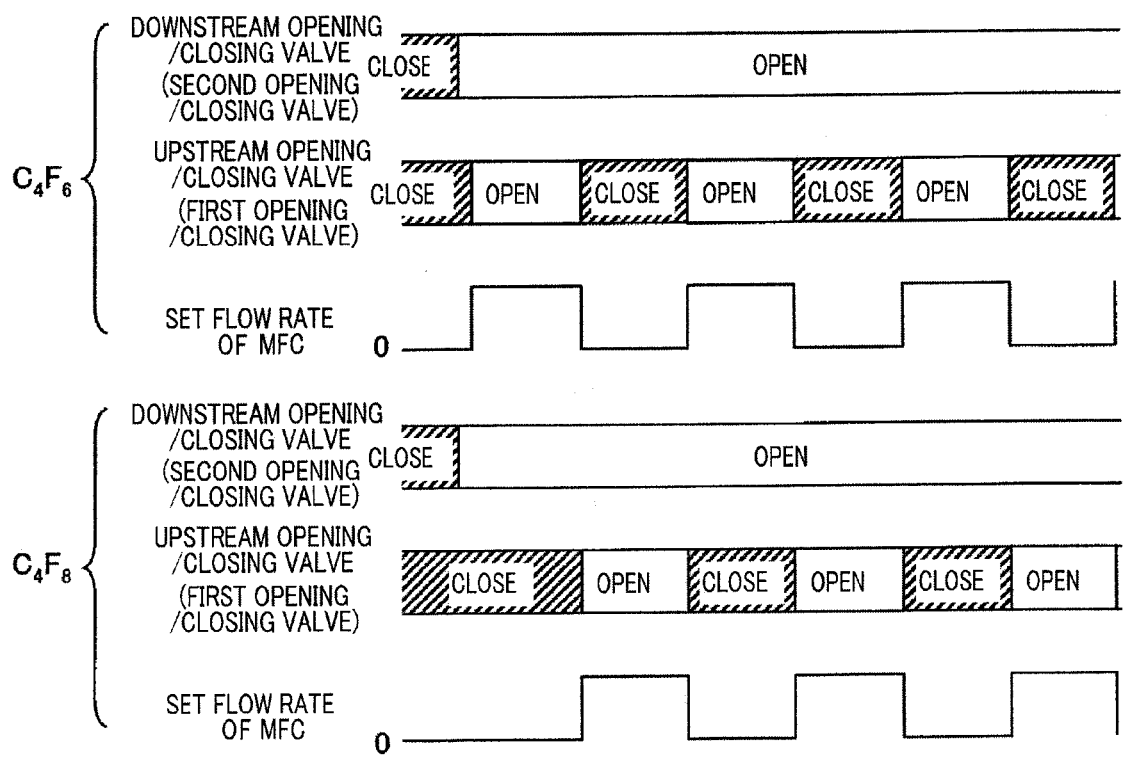
FIG. 4 is a timing chart showing a gas supply control in accordance with the illustrative embodiment.

The gas supply control in accordance with the illustrative embodiment will be discussed in detail with reference to the accompanying drawings. Here, the supply of the processing gas is turned on and off by alternately setting a certain flow rate and a zero flow rate of the mass flow controller 230 while opening and closing the upstream opening/closing valve 220 and opening the downstream opening/closing valve 240. FIG. 4 is a timing chart showing the gas supply control in accordance with the present illustrative embodiment.

In the gas supply control shown in FIG. 4, before the plasma etching is performed on the wafer W, the wafer W is mounted on the lower electrode 110, and the inside of the processing chamber 102 is depressurized to a certain vacuum pressure. Then, the downstream opening/closing valves 240A and 240B respectively provided at the downstream side of the mass flow controllers 230A and 230B for the $C_4F_6$ gas and the $C_4F_8$ gas to be alternately supplied are opened.

Thereafter, while the downstream opening/closing valves 240A and 240B are open, the $C_4F_6$ gas is first supplied, and a certain high frequency power is applied to the lower electrode 110 by the power supply device 130. Accordingly, plasma is generated, and the plasma etching is started. To elaborate, the first high frequency power of the frequency equal to or higher than, e.g., about 27 MHz (e.g., about 40 MHz) is applied to the lower electrode 110 from the first high frequency power supply 132 of the power supply device 130 at a certain value. Further, the second high frequency power of the frequency equal to or lower than, e.g., about 13.56 MHz (e.g., about 2 MHz) is also applied to the lower electrode 110 from the second high frequency power supply 134 of the power supply device 130 at a certain value. Then, after a certain gas supply duration time elapses, the supply of the $C_4F_8$ gas is started. Afterward, these two processing gases are switched alternately and supplied for every gas supply duration time.

In this case, when starting (turning on) the supply of the $C_4F_6$ gas, the upstream opening/closing valve 220A is opened and a certain flow rate of the mass flow controller 230A is set. When stopping (turning off) the supply of the $C_4F_6$ gas, the upstream opening/closing valve 220A is closed and, then, a zero flow rate of the mass flow controller 230A is set. At this time, the downstream opening/closing valve 240A is open. Thus, if the certain flow rate of the mass flow controller 230A is set, the flow rate control valve 235 of the mass flow controller 230A is opened, so that the supply of the $C_4F_6$ gas is started (turned on). If the zero flow rate of the mass flow controller 230A is set, on the other hand, the flow rate control valve 235 is closed, so that the supply of the $C_4F_6$ gas is stopped (turned off).

Likewise, when starting (turning on) the supply of the $C_4F_8$ gas, the upstream opening/closing valve 220B is opened and a certain flow rate of the mass flow controller 230B is set. When stopping (turning off) the supply of the $C_4F_8$ gas, the upstream opening/closing valve 220B is closed and, then, a zero flow rate of the mass flow controller 230B is set. At this time, the downstream opening/closing valve 240B is opened. Thus, if the certain flow rate of the mass flow controller 230B is set, the flow rate control valve 235 of the mass flow controller 230B is opened, so that the supply of the $C_4F_8$ gas is started (turned on). If the zero flow rate of the mass flow controller 230B is set, on the other hand, the flow rate control valve 235 is closed, so that the supply of the $C_4F_8$ gas is stopped (turned off).

In this way, by turning on and off the supplies of the $C_4F_6$ gas and the $C_4F_8$ gas repeatedly a certain number of times while the downstream opening/closing valves 240A and 240B are open, the $C_4F_6$ gas and the $C_4F_8$ gas are alternately switched. Then, upon the completion of the plasma etching, the downstream opening/closing valves 240A and 240B are closed.

Now, with reference to the accompanying drawings, there will be described an experiment result of detecting a variation in a gas flow rate within the processing chamber 102 when the gas supply controls described in FIGS. 3 and 4 are performed. Here, the variation in the gas flow rate is detected by emission intensity of a certain radical component (certain frequency) from a plasma emission spectrum. Further, processing conditions for the experiment are the same as a first processing condition and a second processing condition to be described later.

Figure 5A:
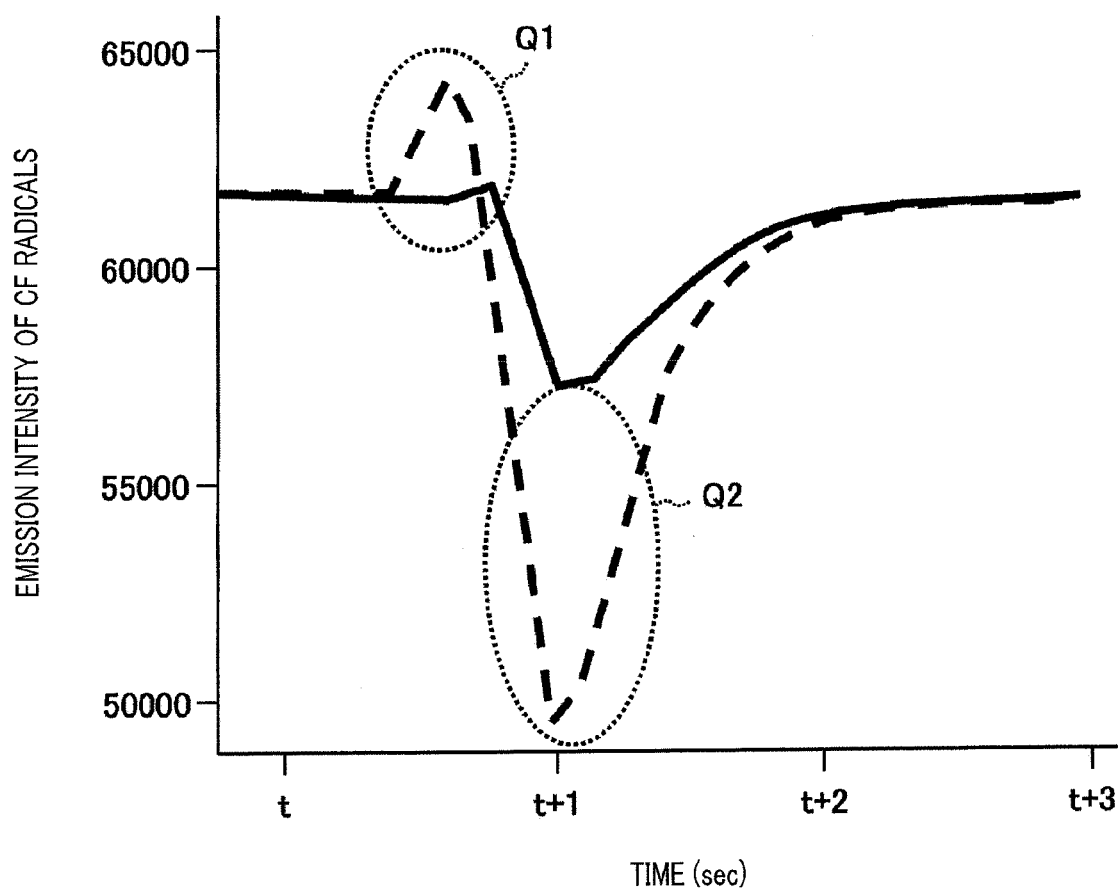
FIG. 5A is a graph showing emission intensity of CF radicals detected from a plasma emission spectrum within a processing chamber as an experiment result of stopping (turning off) supply of a $C_4F_8$ gas and starting (turning on) supply of a $C_4F_6$ gas.
Figure 5B:
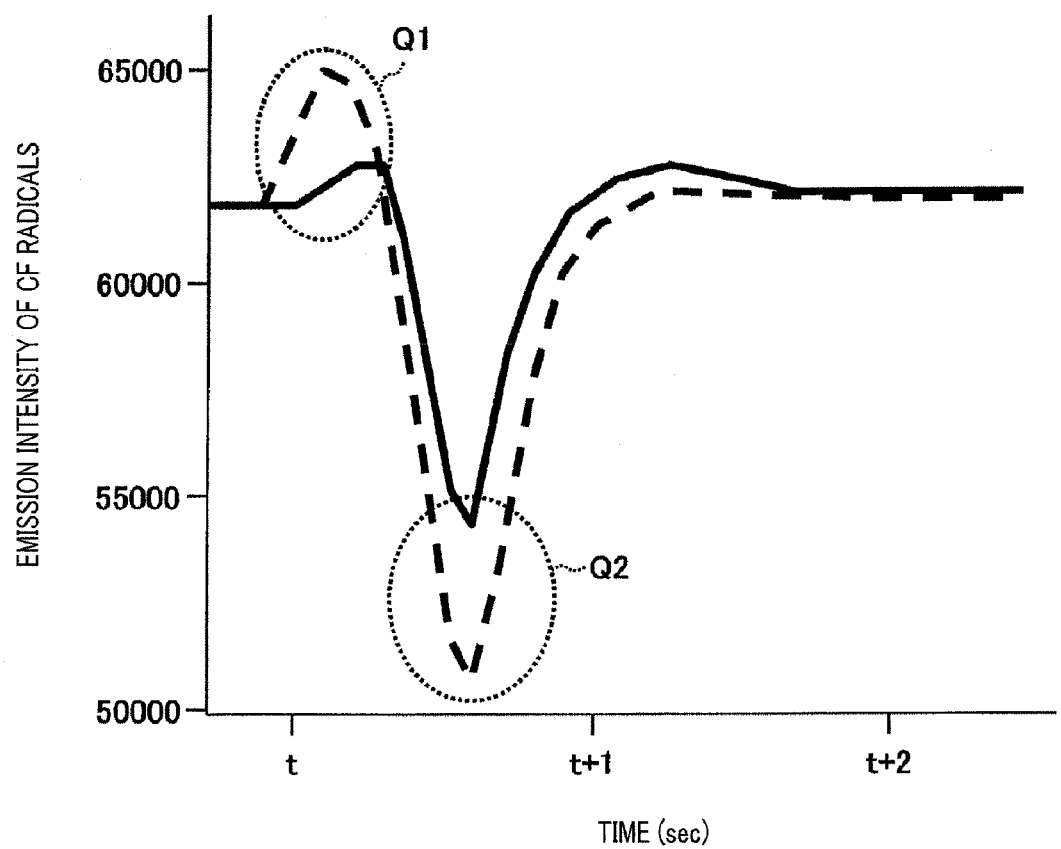
FIG. 5B is a graph showing emission intensity of CF radicals detected from the plasma emission spectrum within the processing chamber as an experiment result of stopping (turning off) the supply of the $C_4F_6$ gas and starting (turning on) the supply of the $C_4F_8$ gas.

FIGS. 5A and 5B illustrate detection results of emission intensity of CF radicals (about 260 nm). FIG. 5A illustrates a detection result when the supply of the $C_4F_8$ gas is stopped (turned off) and the supply of the $C_4F_6$ gas is started (turned on). FIG. 5B illustrates a detection result when the supply of the $C_4F_6$ gas is stopped (turned off) and the supply of the $C_4F_8$ gas is started (turned on). In FIGS. 5A and 5B, a dashed-line indicates a result of the gas supply control (FIG. 3) in accordance with the comparative example, and a solid-line indicates a result of the gas supply control (FIG. 4) in accordance with the present illustrative embodiment.

As can been seen from the experiment results shown in FIGS. 5A and 5B, in both of FIGS. 5A and 5B, the transient phenomenon, such as Q1 and Q2 (indicated by the dashed-line) generated in the gas supply control in accordance with the comparative example, is found to be suppressed in the gas supply control (FIG. 4), which is indicated by the solid-line, in accordance with the present illustrative embodiment.

Figure 6A:
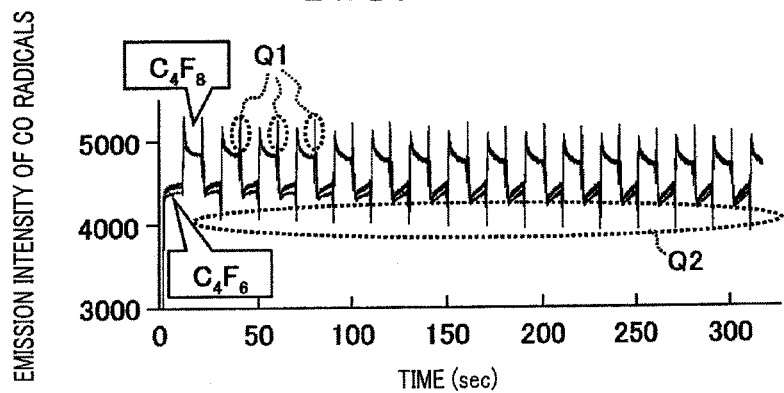
FIG. 6A is a graph showing emission intensity of CO radicals detected from the plasma emission spectrum within the processing chamber as an experiment result of performing a plasma etching by the gas supply control in accordance with the comparative example of FIG. 3.
Figure 6B:
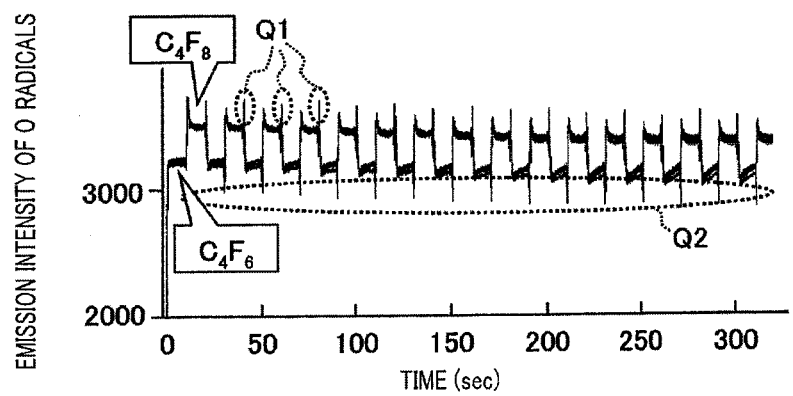
FIG. 6B is a graph showing emission intensity of O radicals detected from the plasma emission spectrum within the processing chamber as an experiment result of performing the plasma etching by the gas supply control in accordance with the comparative example of FIG. 3.
Figure 6C:
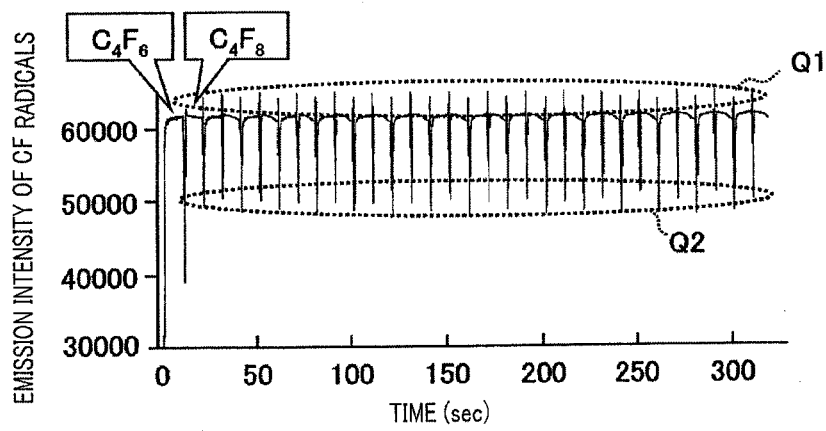
FIG. 6C is a graph showing emission intensity of CF radicals detected from the plasma emission spectrum within the processing chamber as an experiment result of performing the plasma etching by the gas supply control in accordance with the comparative example of FIG. 3.
Figure 7A:
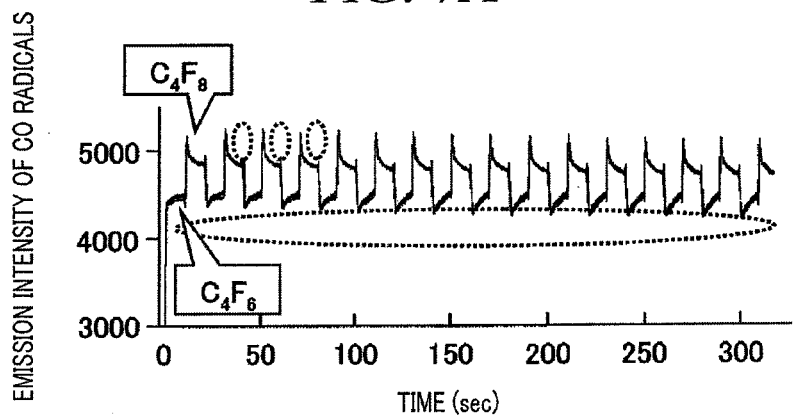
FIG. 7A is a graph showing emission intensity of CO radicals detected from a plasma emission spectrum within the processing chamber as an experiment result of performing a plasma etching by the gas supply control in accordance with the illustrative embodiment of FIG. 4.
Figure 7B:
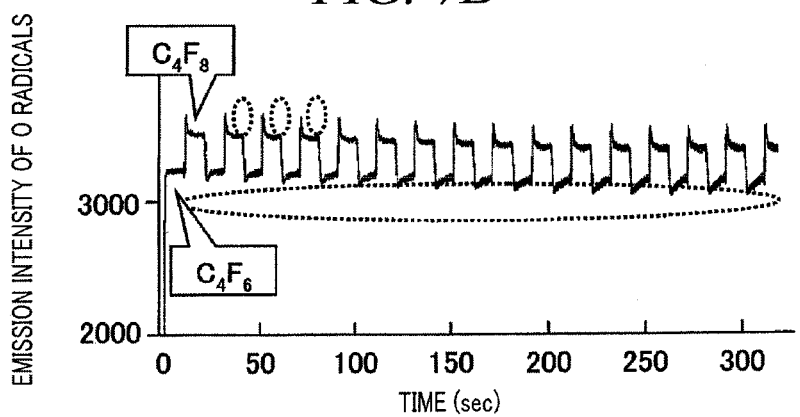
FIG. 7B is a graph showing emission intensity of O radicals detected from the plasma emission spectrum within the processing chamber as an experiment result of performing the plasma etching by the gas supply control in accordance with the illustrative embodiment of FIG. 4.
Figure 7C:
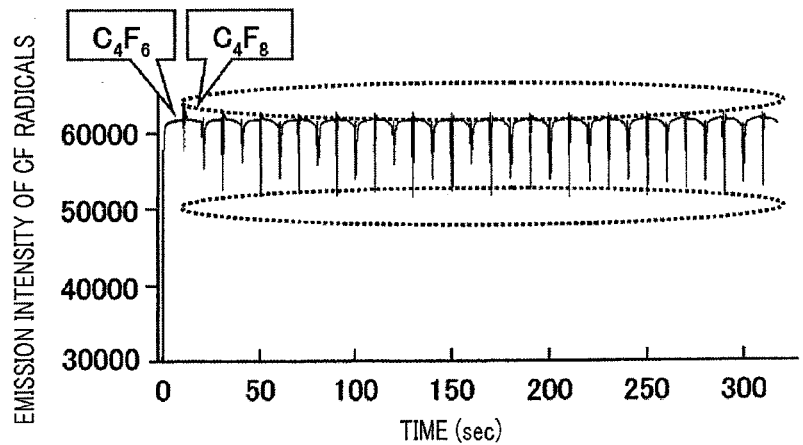
FIG. 7C is a graph showing emission intensity of CF radicals detected from the plasma emission spectrum within the processing chamber as an experiment result of performing the plasma etching by the gas supply control in accordance with the illustrative embodiment of FIG. 4.

Now, with reference to the accompanying drawings, there will be explained an experiment result of performing the etching on the wafer W while alternately switching the $C_4F_6$ gas and the $C_4F_8$ gas multiple times by the gas supply controls shown in FIGS. 3 and 4, respectively. FIGS. 6A to 6C are graphs showing experiment results of the gas supply control in accordance with the comparative example of FIG. 3. FIGS. 7A to 7C are graphs showing experiment results of the gas supply control in accordance with the present illustrative embodiment of FIG. 4.

FIGS. 6A and 7A illustrate detection results of emission intensity of CO radicals (about 483 nm) from a plasma emission spectrum within the processing chamber 102; FIGS. 6B and 7B illustrate detection results of emission intensity of O radicals (about 777 nm); and FIGS. 6C and 7C illustrate detection results of emission intensity of CF radicals (about 260 nm). Further, the dashed-line of FIGS. 5A and 5B correspond to enlargements of a part of FIG. 6C, and the solid-line of FIGS. 5A and 5B correspond to enlargements of a part of FIG. 7C.

In these experiments, the plasma etching process for forming a hole having a certain aspect ratio on a silicon oxide film formed on a wafer W by using a polysilicon film as a mask is performed on a multiple number of wafers W. FIGS. 6A to 6C and FIGS. 7A to 7C illustrate overlapped graphs of the experiment results for the multiple number of wafers W. Major processing conditions for the experiments are as follows. The first processing condition is for a first process performed by using the processing gas having the strong deposition property (here, e.g., $C_4F_6$ gas), and the second processing condition is for a second process performed by using the processing gas having the weak deposition property (e.g., $C_4F_8$ gas). The processes according to the first and second processing conditions are performed alternately, each for about 10 seconds.

[First Processing Condition (First Process)]
Pressure within the processing chamber: about 40 mTorr
Kinds and flow rates of gases: $C_4F_8/C_4F_6/Ar/O_2$=about 0 sccm/about 57 sccm/about 500 sccm/about 20 sccm
First high frequency power (about 40 MHz): about 1200 W
Second high frequency power (about 2 MHz): about 5000 W
Etching time: about 10 seconds

[Second Processing Condition (Second Process)]
Pressure within the processing chamber: about 40 mTorr
Kinds and flow rates of gases: $C_4F_8/C_4F_6/Ar/O_2$=about 57 sccm/about 0 sccm/about 500 sccm/about 40 sccm
First high frequency power (about 40 MHz): about 1200 W
Second high frequency power (about 2 MHz): about 5000 W
Etching time: about 10 seconds According to the experiment results, in all of the cases of the CO radicals, the O radicals, and the CF radicals, the transient phenomenon, such as Q1 and Q2 generated in the gas supply control (FIG. 3) in accordance with the comparative example shown in FIGS. 6A to 6C, is found to be suppressed in the gas supply control (FIG. 4) in accordance with the present illustrative embodiment shown in FIGS. 7A to 7C.

As described above, in accordance with the gas supply control (FIG. 4) of the present illustrative embodiment, as for the processing gases to be alternately supplied, the certain flow rate and the zero flow rate of the mass flow controller 230 are alternately set while the downstream opening/closing valve 240 is open. Accordingly, the flow rate control valve 235 of the mass flow controller 230 can be used just like an opening/closing valve to turn on and turn off the supply of the processing gases repeatedly.

By this gas supply control, a residual gas is prevented from staying at the downstream side of the flow rate control valve 235. Thus, the transient phenomenon of the gas flow rate that might otherwise occur in the processing chamber 102 can be suppressed. Moreover, when switching the processing gases, since the supply of one processing gas is started (turned on) after the supply of the other processing gas is stopped (turned off), there is no possibility that the processing gases can be mixed.

In addition, although the gas supply control depicted in FIG. 4 is described for the case of the downstream opening/closing valve 240 is open during the process of the wafer W, the illustrative embodiment may not be limited thereto. By way of example, during the process of the wafer W, the upstream opening/closing valve 220 as well as the downstream opening/closing valve 240 may be open.

(Modification Example of the Illustrative Embodiment)

Figure 8:
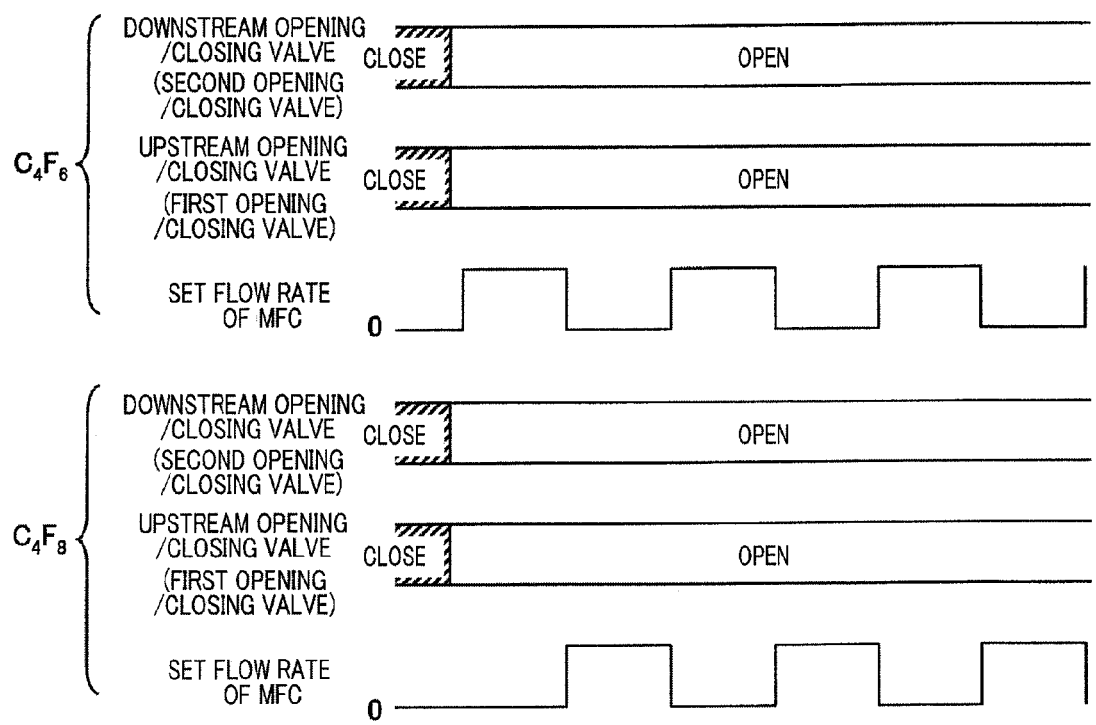
FIG. 8 is a timing chart showing a gas supply control in accordance with a modification example of the illustrative embodiment.

Now, a gas supply control in accordance with a modification example of the above-described illustrative embodiment will be described with reference to the accompanying drawings. According to this gas supply control of the modification example, a plasma etching process is performed while switching processing gases alternately. Here, both of the downstream opening/closing valve 240 and the upstream opening/closing valve 220 of the mass flow controller 230 are open. FIG. 8 is a timing chart showing the gas supply control in accordance with the modification example of the present illustrative embodiment.

In the gas supply control shown in FIG. 8, before a plasma etching is performed on a wafer W, the wafer W is mounted on the lower electrode 110, and the inside of the processing chamber 102 is depressurized to a certain vacuum pressure. Then, the downstream opening/closing valves 240A and 240B respectively provided at the downstream side of the mass flow controllers 230A and 230B for a $C_4F_6$ gas and a $C_4F_8$ gas to be alternately supplied are first opened. Thereafter, the upstream opening/closing valves 220A and 220B respectively provided at the upstream side of the mass flow controllers 230A and 230B are opened.

Thereafter, while the downstream opening/closing valves 240A, 240B and the upstream opening/closing valves 220A, 220B are open, the $C_4F_6$ gas is first supplied, and a certain high frequency power is applied to the lower electrode 110 by the power supply device 130. Accordingly, plasma is generated, and the plasma etching is started. To elaborate, as in the above description, a first high frequency power of a frequency equal to or higher than, e.g., about 27 MHz (e.g., about 40 MHz) is applied to the lower electrode 110 from the first high frequency power supply 132 of the power supply device 130 at a certain value. A second high frequency power of a frequency equal to or lower than, e.g., about 13.56 MHz (e.g., about 2 MHz) is also applied to the lower electrode 110 from the second high frequency power supply 134 of the power supply device 130 at a certain value. Then, after a certain gas supply duration time passes by, the gas is switched and the $C_4F_8$ gas is supplied. Afterward, these processing gases are switched alternately and supplied for every gas supply duration time.

In this case, when starting (turning on) the supply of the $C_4F_6$ gas, a certain flow rate of the mass flow controller 230A is set. When stopping (turning off) the supply of the $C_4F_6$ gas, a zero flow rate of the mass flow controller 230A is set. At this time, both of the upstream opening/closing valve 220A and the downstream opening/closing valve 240A are opened. Thus, if the certain flow rate of the mass flow controller 230A is set, the flow rate control valve 235 of the mass flow controller 230A is opened, so that the supply of the $C_4F_6$ gas is started (turned on). If the zero flow rate of the mass flow controller 230A is set, on the other hand, the flow rate control valve 235 is closed, so that the supply of the $C_4F_6$ gas is stopped (turned off).

Likewise, when starting (turning on) the supply of the $C_4F_8$ gas, a certain flow rate of the mass flow controller 230B is set. When stopping (turning off) the supply of the $C_4F_8$ gas, a zero flow rate of the mass flow controller 230B is set. At this time, both of the upstream opening/closing valve 220B and the downstream opening/closing valve 240B are opened. Thus, if the certain flow rate of the mass flow controller 230B is set, the flow rate control valve 235 of the mass flow controller 230B is opened, so that the supply of the $C_4F_8$ gas is started (turned on). If the zero flow rate of the mass flow controller 230B is set, on the other hand, the flow rate control valve 235 is closed, so that the supply of the $C_4F_8$ gas is stopped (turned off).

In this way, by turning on and off the supply of the $C_4F_6$ gas and the $C_4F_8$ gas repeatedly while the downstream opening/closing valves 240A and 240B and the upstream opening/closing valves 220A and 220B are open, the $C_4F_6$ gas and the $C_4F_8$ gas are alternately switched. Then, upon the completion of the plasma etching, the upstream opening/closing valves 220A and 220B are first closed and, then, the downstream opening/closing valves 240A and 240B are closed. Further, in the gas supply control shown in FIG. 8, the order for opening and closing the downstream opening/closing valves 240A and 240B and the upstream opening/closing valves 220A and 220B is not limited to the mentioned example.

Figure 9A:
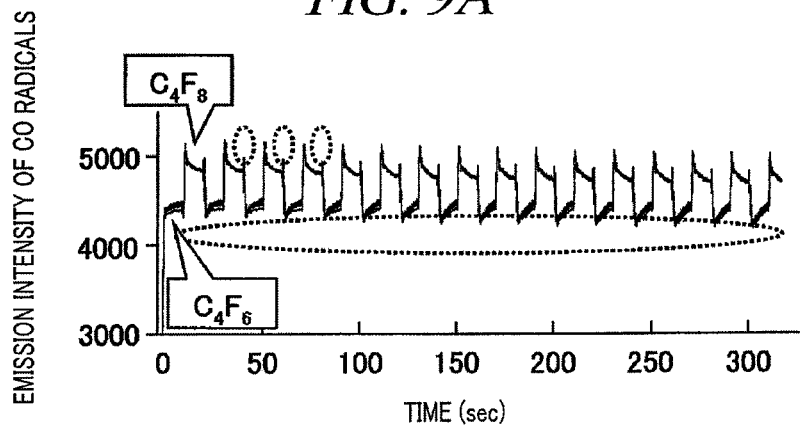
FIG. 9A is a graph showing emission intensity of CO radicals detected from a plasma emission spectrum within the processing chamber as an experiment result of performing a plasma etching by the gas supply control in accordance with the modification example of the illustrative embodiment of FIG. 8.
Figure 9B:
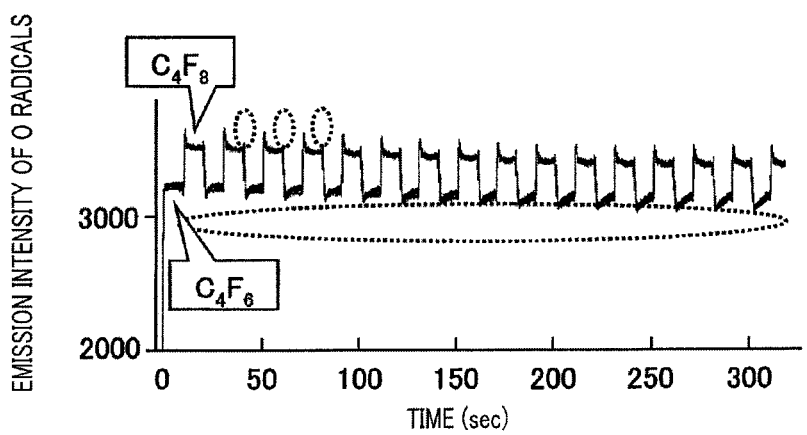
FIG. 9B is a graph showing emission intensity of O radicals detected from the plasma emission spectrum within the processing chamber as an experiment result of performing the plasma etching by the gas supply control in accordance with the modification example of the illustrative embodiment of FIG. 8.
Figure 9C:
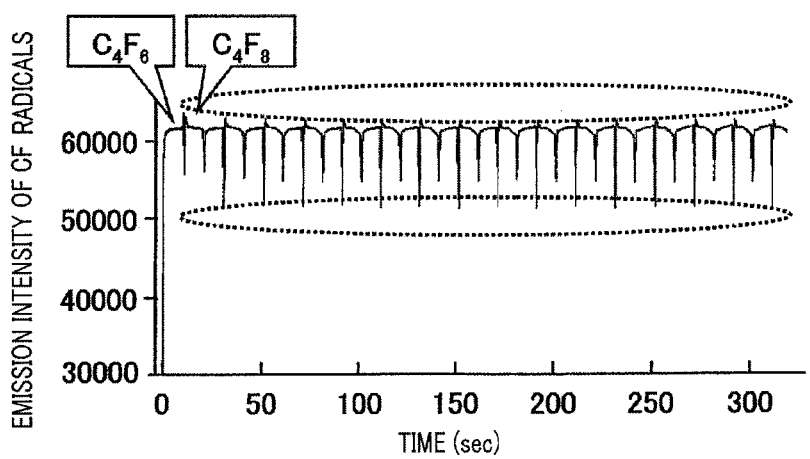
FIG. 9C is a graph showing emission intensity of CF radicals detected from the plasma emission spectrum within the processing chamber as an experiment result of performing the plasma etching by the gas supply control in accordance with the modification example of the illustrative embodiment of FIG. 8.

Now, with reference to the accompanying drawings, there will be explained an experiment result of performing the etching on the wafer W while alternately switching the $C_4F_6$ gas and the $C_4F_8$ gas multiple times in accordance with the gas supply control shown in FIG. 8. FIGS. 9A to 9C illustrate experiment results according to the gas supply control (FIG. 8) in accordance with the modification example of the present illustrative embodiment. FIG. 9A illustrates a detection result of emission intensity of CO radicals from a plasma emission spectrum within the processing chamber 102; FIG. 9B illustrates a detection result of emission intensity of O radicals; and FIG. 9C illustrates a detection result of emission intensity of CF radicals.

In this experiment, the plasma etching process for forming a hole having a certain aspect ratio on an oxide film formed on a wafer W by using a polysilicon film as a mask is performed on a multiple number of wafers W. FIGS. 9A to 9C illustrate overlapped graphs of the experiment results for the multiple number of wafers W. In these experiments, as in the cases of the FIGS. 3 and 4, the processes under the above-described first and second processing conditions are alternately performed, each for about 10 seconds.

According to the experiment results, in all of the cases of the CO radicals, the O radicals, and the CF radicals, the transient phenomenon, such as Q1 and Q2 generated in the gas supply control (FIG. 3) in accordance with the comparative example shown in FIGS. 6A to 6C, is found to be suppressed in the gas supply control (FIG. 8) in accordance with the modification example of the present illustrative embodiment shown in FIGS. 9A to 9C.

As described above, in the gas supply control (FIG. 8) in accordance with the modification example of the present illustrative embodiment, the certain flow rate and the zero flow rate of the mass flow controller 230 are alternately set for the processing gases to be alternately supplied while the downstream opening/closing valves 240A and 240B are open. Accordingly, the flow rate control valve 235 of the mass flow controller 230 can be used just like an opening/closing valve so as to turn on and turn off the supply of the processing gases repeatedly.

Through this gas supply control, a residual gas is prevented from staying at the downstream side of the flow rate control valve 235. Thus, the transient phenomenon of the gas flow rate that might otherwise occur in the processing chamber 102 can be suppressed. Moreover, when switching the processing gases, since the supply of one processing gas is started (turned on) after the supply of the other processing gas is stopped (turned off), there is no possibility that the processing gases can be mixed.

In addition, in the gas supply control (FIG. 8) in accordance with the modification example of the present illustrative embodiment, since the upstream opening/closing valve 220 is also opened, the transient phenomenon of a gas flow rate that might occur in the mass flow controller 230 to be described later can also be prevented.

Below, such a transient phenomenon of the gas flow rate within the mass flow controller 230 will be described in detail with reference to the accompanying drawings. As stated above, in the gas supply control in accordance with the comparative example of FIG. 3, both of the upstream opening/closing valve 220 and the downstream opening/closing valve 240 are closed when stopping (turning off) the supply of each processing gas. Accordingly, as illustrated in FIG. 2, a gas may remain between the upstream opening/closing valve 220 and the downstream opening/closing valve 240, including the inside of the mass flow controller 230.

At this time, the gas supply path 212 has a pressure distribution where a pressure at the upstream side of the upstream opening/closing valve 220, a pressure at the pathway between the upstream opening/closing valve 220 and the flow rate control valve 235, and a pressure at the downstream opening/closing valve 240 have a highest value, middle value and a lowest value in this order.

Accordingly, when opening the upstream opening/closing valve 220 to start (turn on) the supply of each processing gas, a gas remaining at the upstream side of the upstream opening/closing valve 220 shown in FIG. 2 flows into the mass flow controller 230 (between the upstream opening/closing valve 220 and the flow rate control valve 235) at one time. Then, the flow rate control valve 235 is opened and the opening degree thereof is adjusted so that the flow rate control is started. Accordingly, the transient phenomenon in the gas flow rate detected by the flow rate sensor immediately after the supply of the gas is started may easily occur.

In the gas supply control in accordance with the modification example of the illustrative embodiment shown in FIG. 8, however, since the supply of each processing gas is turned on and off while the upstream opening/closing valve 220 as well as the downstream opening/closing valve 240 is open, it is possible to prevent a rush of a gas into the mass flow controller 230 from the upstream side of the upstream opening/closing valve 220 at one time. Thus, it is possible to suppress the transient phenomenon of a gas flow rate within the mass flow controller 230.

Figure 10A:
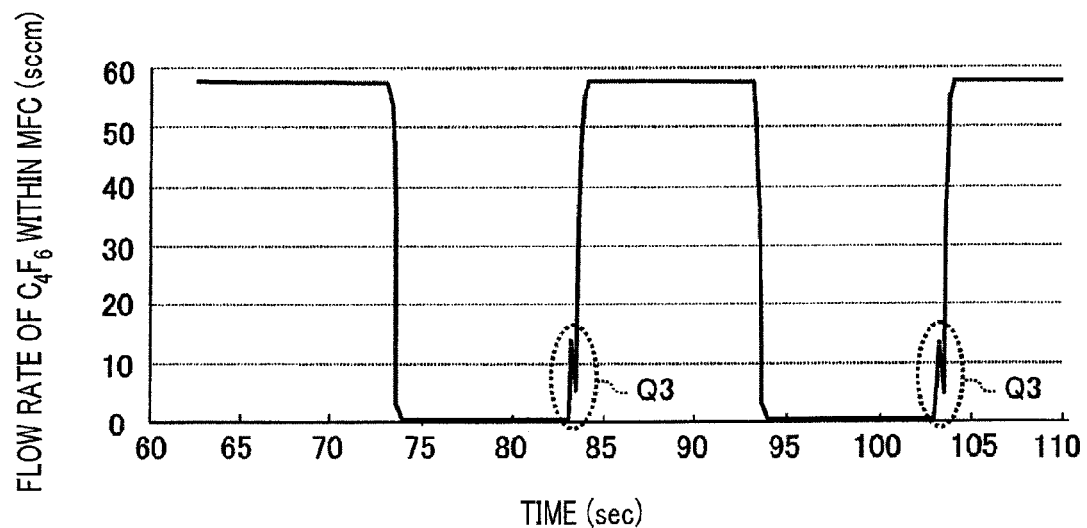
FIG. 10A is a graph showing a flow rate of a $C_4F_6$ gas within a mass flow controller as an experiment result of performing the plasma etching by the gas supply control in accordance with the comparative example of FIG. 3.
Figure 10B:
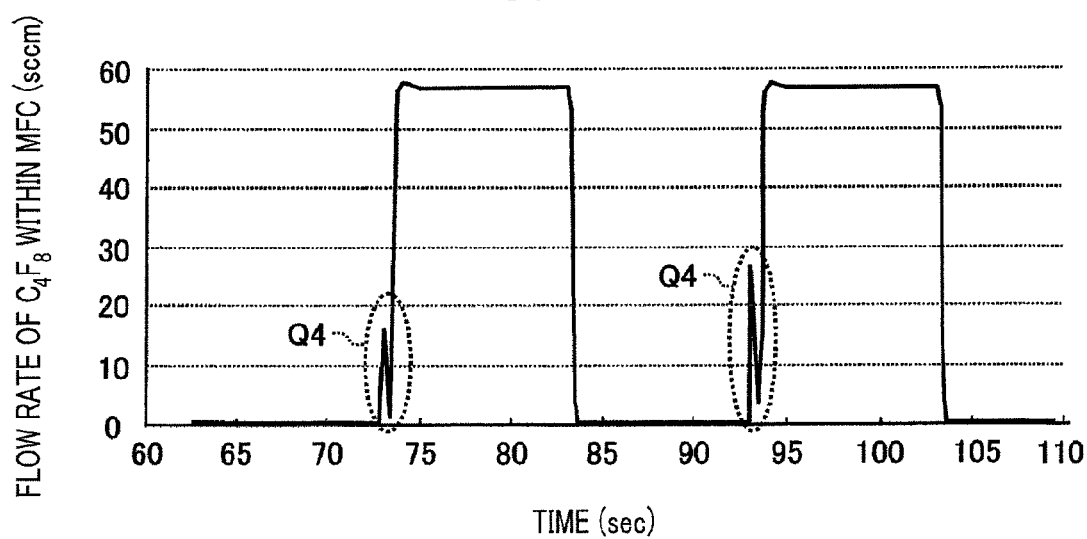
FIG. 10B is a graph showing a flow rate of a $C_4F_8$ gas within the mass flow controller as an experiment result of performing the plasma etching by the gas supply control in accordance with the comparative example of FIG. 3.
Figure 11A:
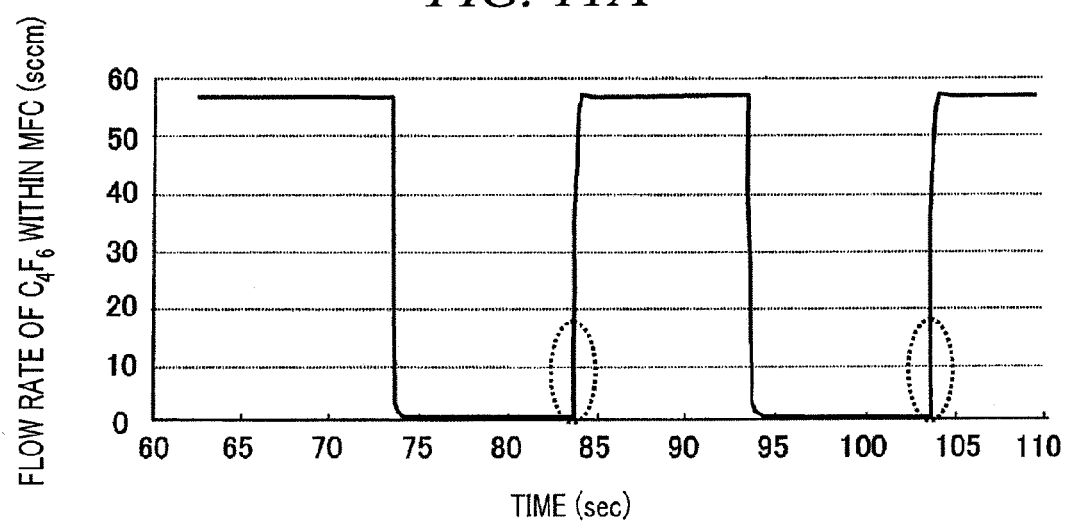
FIG. 11A is a graph showing a flow rate of a $C_4F_6$ gas within the mass flow controller as an experiment result of performing the plasma etching by the gas supply control in accordance with the modification example of the illustrative embodiment of FIG. 8.
Figure 11B:
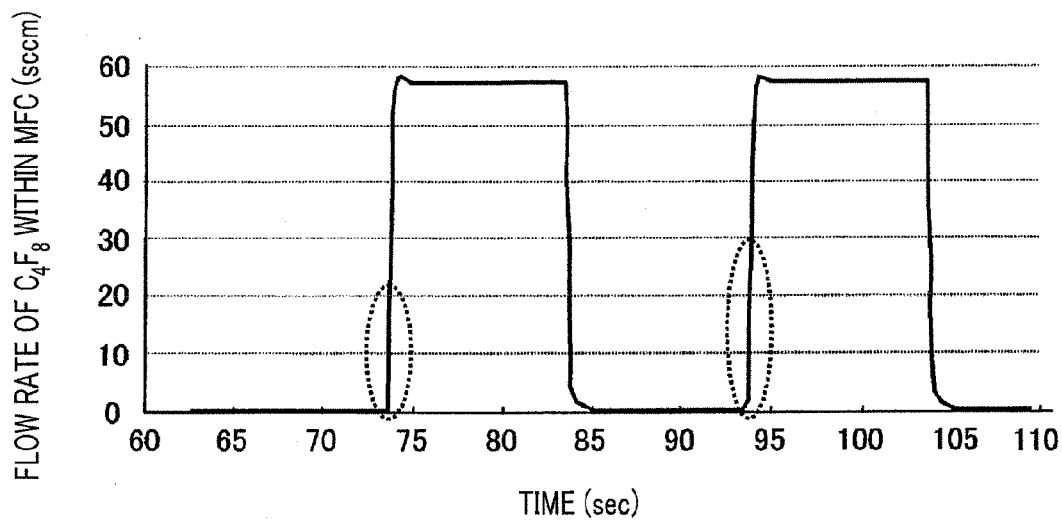
FIG. 11B is a graph showing a flow rate of a $C_4F_8$ gas within the mass flow controller as an experiment result of performing the plasma etching by the gas supply control in accordance with the modification example of the illustrative embodiment of FIG. 8.

Now, with reference to the accompanying drawings, there will be explained experiment results of performing plasma etchings on the wafer W while alternately switching the $C_4F_6$ gas and the $C_4F_8$ gas multiple times in accordance with the gas supply controls shown in FIGS. 3 and 8. FIGS. 10A and 10B illustrate experiment results of the gas supply control (FIG. 3) in accordance with the comparative example. FIGS. 11A and 11B illustrate experiment results of the gas supply control (FIG. 8) in accordance with the modification example of the illustrative embodiment.

FIGS. 10A and 11A illustrate graphs showing a change in a flow rate of a $C_4F_6$ gas detected by a flow rate sensor within the mass flow controller 230A with the passage of time. FIGS. 10B and 11B illustrate graphs showing a change in a flow rate of a $C_4F_8$ gas detected by a flow rate sensor within the mass flow controller 230B with the passage of time.

According to the experiment results, the transient phenomenon, such as Q3 and Q4 generated in the gas supply control (FIG. 3) in accordance with the comparative example shown in FIGS. 10A and 10B, is found to be suppressed in the gas supply control (FIG. 8) in accordance with the modification example of the present illustrative embodiment shown in FIGS. 11A and 11B.

As stated above, in the gas supply control (FIG. 8) in accordance with the modification example of the present illustrative embodiment, a certain flow rate and a zero flow rate of the mass flow controller 230 are alternately set while the upstream opening/closing valve 220 as well as the downstream opening/closing valve 240 is opened. Accordingly, not only the transient phenomenon of the gas flow rate within the processing chamber 102 but also the transient phenomenon of the gas flow rate within the mass flow controller 230 can be suppressed.

Meanwhile, when the plasma etching is performed while switching the processing gases as in the present illustrative embodiment, a hole or a trench having a higher aspect ratio can be formed as the gas supply duration time is set to be shorter. However, as the gas supply duration time for the processing gases is set to be shorter, the transient phenomenon of the gas flow rate may be more likely to occur.

Accordingly, the gas supply controls described in FIGS. 4 and 8 may be performed only when the gas supply duration time is below a threshold value. When the gas supply duration time is not below the threshold value, the gas supply control shown in FIG. 3 may be performed. In such a case, desirably, the threshold value for the gas supply duration time may be set to be in a range from, e.g., about 1 second to, e.g., about 15 seconds.

With this method, the gas supply controls shown in FIGS. 4 and 8 may be performed only when the gas supply duration time is short and the transient phenomenon of the gas flow rate is highly likely to occur. Accordingly, it is possible to securely and appropriately suppress the transient phenomenon of the gas flow rate that might easily occur when forming a deep hole or a trench having a high aspect ratio. Further, it may be determined whether or not to perform the gas supply controls shown in FIGS. 4 and 8 depending on the aspect ratio of the hole or the trench.

Furthermore, in the gas supply control shown in FIG. 4, the timing for opening and closing the downstream opening/closing valve 240 is not limited to the aforementioned example. By way of example, the downstream opening/closing valve 240 may be opened before each processing gas is firstly supplied. Further, the downstream opening/closing valve 240 may be closed after each processing gas is supplied lastly.

Further, in the gas supply control shown in FIG. 8, the timing for opening and closing the downstream opening/closing valve 240 and the upstream opening/closing valve 220 is not limited the aforementioned example. By way of example, each of the opening/closing valves 220 and 240 may be opened before each processing gas is firstly supplied. Further, each of the opening/closing valves 220 and 240 may be closed after each processing gas is supplied lastly.

Moreover, the present illustrative embodiment has been described for the case of providing the opening/closing valves 220 and 240 at both the upstream side and the downstream side of the mass flow controller 230, respectively. However, the illustrative embodiment is not limited thereto and is also applicable to a configuration in which an opening/closing valve is not provided at the upstream side of the mass flow controller but provided only at the downstream side thereof.

Furthermore, in the above-described illustrative embodiment, the two kinds of etching gases, i.e., the $C_4F_6$ gas and the $C_4F_8$ gas are illustrated as multiple processing gases supplied into the processing chamber 102 while being switched alternately. However, the processing gases are not limited thereto. By way of example, an etching gas (e.g., a $C_4F_6$ gas) and a cleaning gas (e.g., an $O_2$ gas) may be alternately switched. In such a case, when performing the etching process and the cleaning process repeatedly, the transient phenomenon of the gas flow rate can be suppressed.

In addition, the number of the kinds of the alternately supplied processing gases is not limited to, but three or more kinds of processing gases may be alternately supplied. Further, the illustrative embodiment is applicable not only to the etching or cleaning process but also to a film forming process in which two or more kinds of processing gases are alternately supplied.

Moreover, in the above-described illustrative embodiment, although the mass flow controller is used as a flow rate controller, any type of flow rate controller may be used as long as the flow rate controller controls a flow rate by adjusting the opening degree of a flow rate control valve. By way of example, a FCS (Flow Control System (registered trademark)) may be used.

While various aspects and embodiments have been described herein, other aspects and embodiments will be apparent to those skilled in the art. The various aspects and embodiments disclosed herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

For example, in the above-described illustrative embodiment, the plasma processing apparatus generates plasma by applying high frequency powers of two different frequencies only to the lower electrode. However, the plasma processing apparatus is not limited thereto. By way of example, the illustrative embodiment is also applicable to a plasma processing apparatus that generates plasma by applying a high frequency power of a single frequency only to the lower electrode, or that generates plasma by applying high frequency powers of two different frequencies to the upper electrode and the lower electrode, respectively.

Further, the illustrative embodiment is not limited to such a parallel plate type capacitively coupled plasma processing apparatus but also applicable to, for example, an inductively coupled plasma processing apparatus.

INDUSTRIAL APPLICABILITY

The present illustrative embodiment is applicable to a plasma processing apparatus capable of supplying a multiple number of processing gases into a processing chamber and a gas supply method therefor.

What is claimed is:

1. A gas supply method used in a plasma processing apparatus that supplies a gas into an evacuable processing chamber to generate plasma and that performs a plasma process on a substrate within the processing chamber by the plasma,
   wherein the plasma processing apparatus comprises:
   a gas supply system, having multiple processing gas supply sources and multiple gas supply paths respectively connected to the processing gas supply sources, for supplying a plurality of processing gases into the processing chamber via the gas supply paths;
   a flow rate controller provided at each of the gas supply paths and configured to control a flow rate of a processing gas flowing in the gas supply path by adjusting an opening degree of a flow rate control valve according to an instruction flow rate; and
   a downstream opening/closing valve provided at a downstream side of each flow rate controller,
   wherein the gas supply method comprises:
   when supplying at least two kinds of processing gases into the processing chamber while alternately switching the at least two kinds of processing gases during the plasma process on the substrate, alternately turning on and off the supply of each processing gas by alternately setting the instruction flow rate of the flow rate controller to be a predetermined flow rate and a zero flow rate while the downstream opening/closing valve provided at the downstream side of the flow rate controller is open,
   wherein when supplying the processing gases into the processing chamber while alternately switching the processing gases, it is determined whether a supply duration time before switching each processing gas is equal to or smaller than a threshold value,
   if it is determined that the supply duration time is equal to or smaller than the threshold value, the supply of the processing gas is turned on and off by alternately setting instruction flow rate of the flow rate controller to be the predetermined flow rate and the zero flow rate while the downstream opening/closing valve is open, and
   if it is determined that the supply duration time is larger than the threshold value, the supply of the processing gas is turned on and off by opening and closing the downstream opening/closing valve.

2. The gas supply method of claim 1,
   wherein the plasma processing apparatus further comprises an upstream opening/closing valve provided at an upstream side of each flow rate controller, and
   the supply of each processing gas is alternately turned on and off by alternately setting the instruction flow rate of the flow rate controller to be a predetermined flow rate and a zero flow rate while the upstream opening/closing valve provided at the upstream side of the flow rate controller as well as the downstream opening/closing valve provided at the downstream side of the flow rate controller is open.

3. The gas supply method of claim 1,
   wherein the threshold value is set to be in a range of about 1 second to about 15 seconds.

4. The gas supply method of claim 1,
wherein the switched processing gases are at least two kinds of etching gases.

5. The gas supply method of claim 1,
wherein the switched processing gases include at least an etching gas and a cleaning gas.

6. A plasma processing apparatus that supplies a gas into an evacuable processing chamber to generate plasma and that performs a plasma process on a substrate by the plasma, the plasma processing apparatus comprising:
- a gas supply system, having multiple processing gas supply sources and multiple gas supply paths respectively connected to the processing gas supply sources, for supplying a plurality of processing gases into the processing chamber via the gas supply paths;
- a flow rate controller provided at each of the gas supply paths and configured to control a flow rate of a processing gas flowing in the gas supply path by adjusting an opening degree of a flow rate control valve according to an instruction flow rate;
- an opening/closing valve provided at a downstream side of each flow rate controller; and
- a controller configured to set a flow rate of the flow rate controller, wherein when supplying at least two kinds of processing gases into the processing chamber while alternately switching the at least two kinds of processing gases during the plasma process on the substrate, the controller alternately turns on and off the supply of each processing gas by alternately setting the instruction flow rate of the flow rate controller to be a predetermined flow rate and a zero flow rate while the opening/closing valve provided at the downstream side of the flow rate controller is open, wherein when supplying the processing gases into the processing chamber while alternately switching the processing gases, it is determined whether a supply duration time before switching each processing gas is equal to or smaller than a threshold value, if it is determined that the supply duration time is equal to or smaller than the threshold value, the supply of the processing gas is turned on and off by alternately setting instruction flow rate of the flow rate controller to be the predetermined flow rate and the zero flow rate while the downstream opening/closing valve is open, and if it is determined that the supply duration time is larger than the threshold value, the supply of the processing gas is turned on and off by opening and closing the downstream opening/closing valve.

* * * * *